(12) United States Patent
Sakai et al.

(10) Patent No.: US 8,034,447 B2
(45) Date of Patent: Oct. 11, 2011

(54) ELECTRONIC COMPONENTS MOUNTING ADHESIVE AND ELECTRONIC COMPONENTS MOUNTING STRUCTURE

(75) Inventors: Tadahiko Sakai, Fukuoka (JP); Hideki Eifuku, Fukuoka (JP); Kouji Motomura, Saga (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/096,234

(22) PCT Filed: Sep. 13, 2007

(86) PCT No.: PCT/JP2007/068331
§ 371 (c)(1),
(2), (4) Date: Jun. 5, 2008

(87) PCT Pub. No.: WO2008/032870
PCT Pub. Date: Mar. 20, 2008

(65) Prior Publication Data
US 2009/0291314 A1    Nov. 26, 2009

(30) Foreign Application Priority Data
Sep. 15, 2006 (JP) .................. 2006-251070

(51) Int. Cl.
*B32B 7/12* (2006.01)
*H05K 1/02* (2006.01)

(52) U.S. Cl. .................. 428/356; 428/355 EP; 257/789; 257/793; 174/259

(58) Field of Classification Search .................. 174/257, 174/259; 257/789, 793; 428/355 R, 355 EP, 428/356
See application file for complete search history.

(56) References Cited

U.S. PATENT DOCUMENTS

| | | | | |
|---|---|---|---|---|
| 4,568,592 A | * | 2/1986 | Kawaguchi et al. | 428/107 |
| 4,696,764 A | * | 9/1987 | Yamazaki | 252/503 |
| 4,939,913 A | * | 7/1990 | Scungio et al. | 63/21 |
| 5,136,365 A | * | 8/1992 | Pennisi et al. | 257/783 |
| 5,445,308 A | * | 8/1995 | Nelson et al. | 228/121 |
| 5,578,527 A | * | 11/1996 | Chang et al. | 156/273.9 |
| 5,949,138 A | | 9/1999 | Palasi et al. | |
| 5,965,064 A | * | 10/1999 | Yamada et al. | 252/512 |
| 5,985,043 A | | 11/1999 | Zhou et al. | |
| 5,985,456 A | | 11/1999 | Zhou et al. | |
| 5,998,861 A | | 12/1999 | Hiruta | |
| 6,013,713 A | * | 1/2000 | Cotte et al. | 524/439 |

(Continued)

FOREIGN PATENT DOCUMENTS
EP    1333079    8/2003
(Continued)

OTHER PUBLICATIONS
International Search Report Dated Mar. 12, 2008.
(Continued)

*Primary Examiner* — Cathy Lam
(74) *Attorney, Agent, or Firm* — Pearne & Gordon LLP

(57) ABSTRACT

The invention intends to provide an electronic component mounting adhesive that can inhibit cracks and peelings in an electronic component mounting structure obtained by joining electronic components each other from occurring and an electronic component mounting structure obtained by joining electronic components with such an electronic component mounting adhesive. In an electronic component mounting structure, a first circuit board and a second circuit board are bonded with an electronic component mounting adhesive. Here, the electronic component mounting adhesive is obtained by dispersing metal particles having the melting temperature Mp lower than the glass transition temperature Tg of a cured material of a thermosetting resin in the thermosetting resin.

7 Claims, 3 Drawing Sheets

U.S. PATENT DOCUMENTS

| | | | |
|---|---|---|---|
| 6,017,634 A | 1/2000 | Capote et al. | |
| 6,096,411 A * | 8/2000 | Nakatani et al. | 428/209 |
| 6,121,689 A | 9/2000 | Capote et al. | |
| 6,132,646 A | 10/2000 | Zhou et al. | |
| 6,297,560 B1 | 10/2001 | Capote et al. | |
| 6,331,679 B1 * | 12/2001 | Higashi | 174/260 |
| 6,335,571 B1 | 1/2002 | Capote et al. | |
| 6,399,426 B1 | 6/2002 | Capote et al. | |
| 6,518,677 B1 | 2/2003 | Capote et al. | |
| 6,566,234 B1 | 5/2003 | Capote et al. | |
| 6,774,493 B2 | 8/2004 | Capote et al. | |
| 6,833,180 B1 * | 12/2004 | Kodemura | 428/220 |
| 7,888,411 B2 | 2/2011 | Wrosch et al. | |
| 2002/0014703 A1 | 2/2002 | Capote et al. | |
| 2004/0173891 A1 | 9/2004 | Imai et al. | |
| 2005/0218517 A1 | 10/2005 | Capote et al. | |
| 2006/0194920 A1 | 8/2006 | Capote et al. | |

FOREIGN PATENT DOCUMENTS

| | | |
|---|---|---|
| EP | 1615263 | 1/2006 |
| JP | 09-92685 A | 4/1997 |
| JP | 2000-133681 A | 5/2000 |
| JP | 2001-510205 A | 7/2001 |
| JP | 2004-221189 A | 8/2004 |
| JP | 2004-323777 | 11/2004 |
| JP | 2004-356620 A | 12/2004 |
| JP | 2006-169395 | 6/2006 |
| JP | 2006-173586 A | 6/2006 |
| WO | 2004/090942 A2 | 10/2004 |
| WO | 2006064831 | 6/2006 |

OTHER PUBLICATIONS

Shijian Luo et al.; "Thermo-mechanical properties of epoxy formulations with low glass transition temperatures"; Advanced packaging materials, 2002. Proceedings. 2002 8th International Symposium on Mar. 3-6, 2002, Piscataway, NJ, USA, IEE, Mar. 3, 2002, pp. 226-231.

Japanese Office Action for application 2006-251070 dated Jan. 18, 2011.

* cited by examiner

ELECTRONIC COMPONENTS MOUNTING ADHESIVE AND ELECTRONIC COMPONENTS MOUNTING STRUCTURE

TECHNICAL FIELD

The invention relates to an electronic component mounting adhesive used for joining electronic components and an electronic component mounting structure obtained by joining the electronic components with the electronic component mounting adhesive.

BACKGROUND ART

Among electronic component mounting structures where an electronic component such as a semiconductor chip or a circuit board and another electronic component are joined, there is one where electrodes are each other electrically and mechanically bonded via a solder and, simultaneously, the both electronic components are strongly bonded by a cured material of a thermosetting resin thermally cured in a space between the both electronic components. In such an electronic component mounting structure, even when a large temperature variation is imparted by the heat cycle test, an entire cured material of the thermosetting resin can receive the thermal stress generated owing to the difference of the linear expansion coefficients of the both electronic components; accordingly, concentration of the thermal stress on a joining surface of the electrodes can be avoided. In this case, the thermosetting resin works as an electronic component mounting adhesive that bonds the both the electronic components. The thermosetting resin is, when the electrodes of the both electronic components are connected each other or after the electrodes are connected each other, fed between the both electronic components and thermally cured.

[Patent literature 1] JP-A No. 2006-169395
[Patent literature 2] JP-A No. 2004-323777

DISCLOSURE OF THE INVENTION

Now, a cured material of the thermosetting resin that is an organic material generally has the glass transition temperature where the physical properties drastically change. When a temperature is raised exceeding the glass transition temperature, while the linear expansion coefficient rapidly increases, the longitudinal elastic modulus (Young's modulus) rapidly decreases. That is, a cured material of the thermosetting resin, when heated exceeding the glass transition temperature thereof, softens and tends to thermally expand. However, a temperature where the linear expansion coefficient rapidly increases (thermally expands) and a temperature where the longitudinal elastic modulus rapidly decreases (softens) do not necessarily coincide. In the case of the former temperature being lower than the latter temperature, when, in the heat cycle test of the electronic component mounting structure, the cured material of the thermosetting resin is heated exceeding the glass transition temperature thereof, the cured material starts rapidly thermally expanding in a hard state; accordingly, on a joining surface of the cured material and the electronic component, a large thermal stress works to in some cases generate cracks and peelings on a joining surface.

In this connection, the invention intends to provide an electronic component mounting adhesive that can inhibit cracks and peelings from occurring in an electronic component mounting structure obtained by joining electronic components each other and an electronic component mounting structure obtained by joining electronic components with such an electronic component mounting adhesive.

An electronic component mounting adhesive according to the invention can be obtained by dispersing, in a thermosetting resin, metal particles having the melting temperature lower than the glass transition temperature of a cured material of the thermosetting resin.

The electronic component mounting adhesive of the invention preferably contains the metal particles by 20% by volume or less.

The electronic component mounting adhesive of the invention preferably includes the metal particles made of an alloy containing Sn and at least one metal selected from Pb, Ag, Zn, Bi, In, Sb and Cu.

The electronic component mounting adhesive of the invention preferably includes an inorganic filler dispersed in a thermosetting resin.

The electronic component mounting adhesive of the invention preferably includes the metal particles having particle diameters of 30 μm or less.

The electronic component mounting adhesive of the invention preferably includes the metal particles of which melting temperature is lower by 10° C. or more than the glass transition temperature of a cured material of the thermosetting resin.

An electronic component mounting structure of the invention includes a first electronic component with an electrode; a second electronic component with an electrode that is electrically connected to the electrode of the first electronic component; and an adhesive cured material that is obtained by curing an electronic component mounting adhesive mainly made of a thermosetting resin and connects both the electronic components, wherein, in the adhesive cured material, metal particles having the melting temperature lower than the glass transition temperature of a cured material of the thermosetting resin are contained.

The electronic component mounting structure of the invention preferably includes the metal particles of which melting temperature is lower by 10° C. or more than the glass transition temperature of a cured material of the thermosetting resin.

In the case of a cured material of an electronic component mounting adhesive (adhesive cured material) of the. invention being heated, when a temperature of the adhesive cured material comes close to the glass transition temperature of a cured material of a simple thermosetting resin (resin cured material), the linear expansion coefficient of the adhesive cured material rapidly increases to largely thermally expand the adhesive cured material. However, since metal particles contained in the adhesive cured material melt before a temperature of the adhesive cured material reaches the glass transition temperature of the resin cured material, apparent longitudinal elastic modulus of the adhesive cured material decreases and thereby the adhesive cured material starts softening. That is, when the adhesive cured material is heated exceeding the glass transition temperature of the resin cured material, the adhesive cured material starts softening and largely thermally expands thereafter.

Accordingly, by use of the electronic component mounting adhesive of the invention, electronic components are joined each other. In an electronic component mounting structure where a cured material of the electronic component mounting adhesive of the invention is interposed between the electronic components, even when a large temperature variation due to the heat cycle test is applied, the thermal stress acted on a joining surface of the adhesive cured material and the electronic component does not become excessively large and thereby the cracks and peelings on the joining surface can be inhibited from occurring.

BEST MODE FOR CARRYING OUT THE INVENTION

Figure 1:
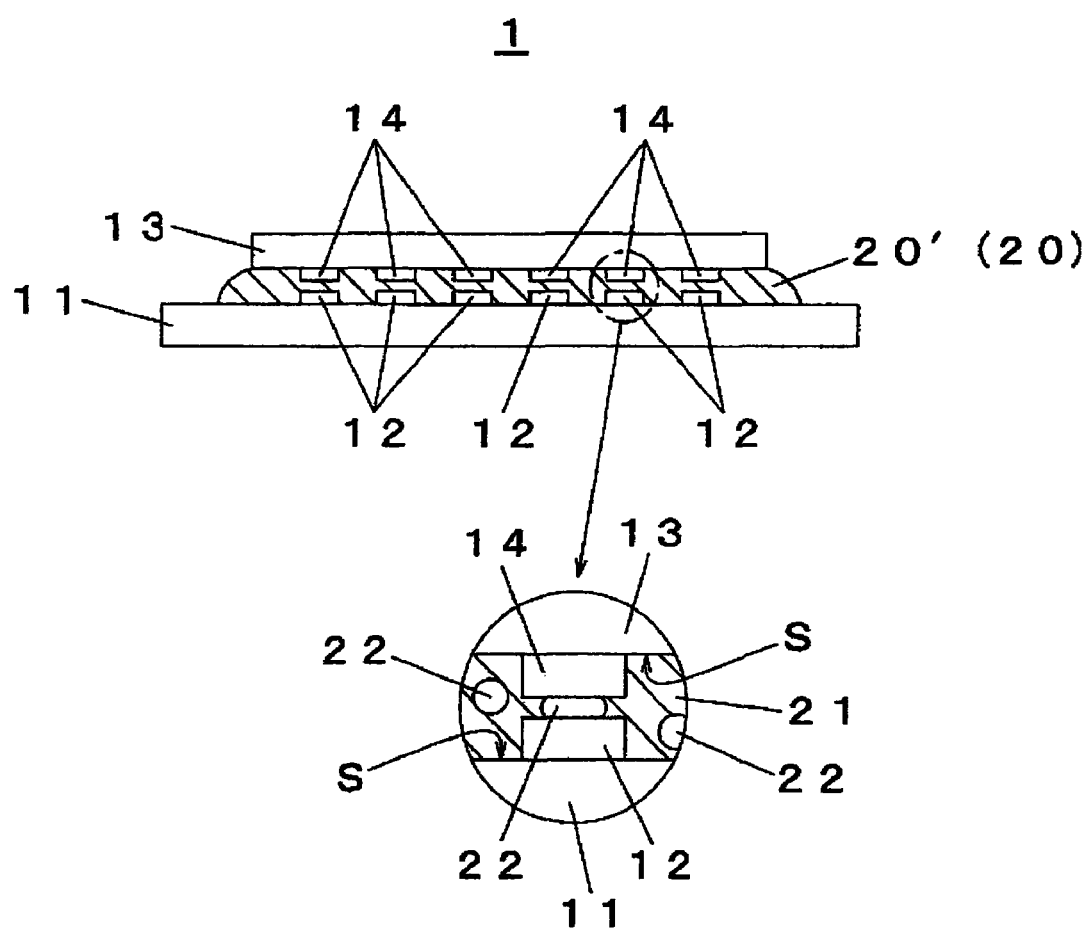
FIG. 1 is a sectional view of an electronic component mounting structure in one embodiment of the invention.

In what follows, embodiments of the invention will be described with reference to the drawings. FIG. 1 is a sectional view of an electronic component mounting structure in one embodiment of the invention, FIGS. 2A through 2C being process charts for producing an electronic component mounting structure of one embodiment of the invention, FIG. 3 being a graph showing relationship between temperature and the longitudinal elastic modulus of an adhesive cured material in one embodiment of the invention.

In FIG. 1, in an electronic component mounting structure 1, electrodes 12 of a first circuit board 11 and electrodes 14 of a second circuit board 13 are electrically connected, and both circuit boards 11 and 13 are joined with an adhesive cured material 20' obtained by thermally curing an electronic component mounting adhesive (hereinafter, simply referred to as adhesive) 20 of which main component is a thermosetting resin 21. The first circuit board 11 and the second circuit board 13, respectively, are an example of an electronic component. Other than the circuit board, a semiconductor chip, resistance and capacitor may be used.

Figure 2A:
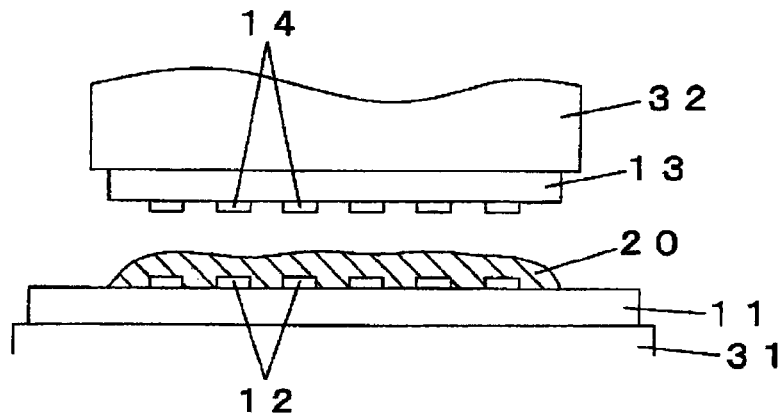
FIGS. 2A through 2C are production process charts of an electronic component mounting structure in one embodiment of the invention.
Figure 2B:
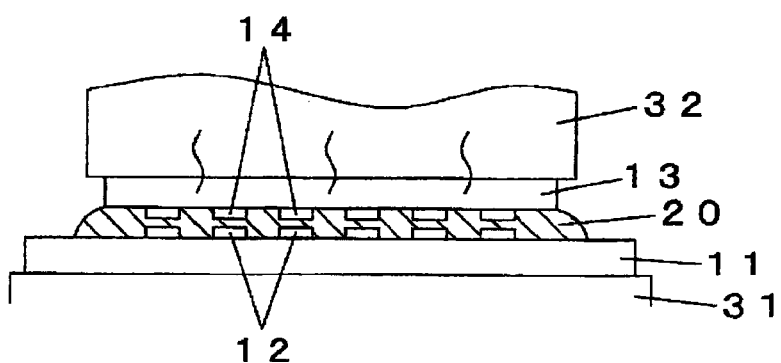
Figure 2C:
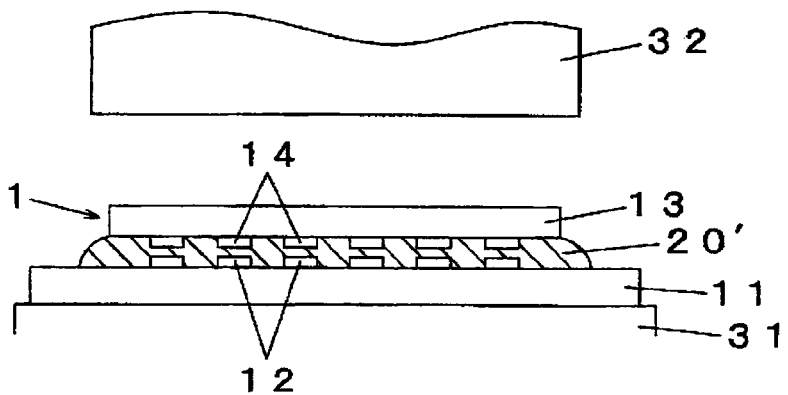

According to a producing procedure of the electronic component mounting structure 1, as shown in FIGS. 2A through 2C, in the beginning, a first circuit board 11 is held on a top surface of a holding table 31 so that electrodes 12 of the circuit board 11 may be directed upward and an adhesive 20 is coated on a surface of the first circuit board 11 by use of a dispenser (FIG. 2A). At this time, all electrodes 12 of the first circuit board 11 are covered with the adhesive 20.

After the adhesive 20 is coated on a surface of the first circuit board 11, a thermocompression bonding head 32 by which a second circuit board 13 is sucked is located above the first circuit board 11. Then, after the electrodes 12 of the first circuit board 11 and the electrodes 14 of the second circuit board 13 are aligned, the second circuit board 13 is relatively neared to the first circuit board 11 so that the electrodes 14 of the second circuit board 13 may come close to the electrodes 12 of the first circuit board 11 from above (by lowering the thermocompression bonding head 32), followed by heating the both circuit boards 11 and 13 (FIG. 2B). Thereby, the adhesive 20 between the both circuit boards 11 and 13 is thermally cured to be an adhesive cured material 20' to strongly bond the both circuit boards 11 and 13. Furthermore, during the thermocompression process, metal particles 22 in the adhesive 20 (adhesive cured material 20') sandwiched between the electrodes 12 of the first circuit board 11 and the electrodes 14 of the second circuit board 13 melt and expand between the both electrodes 12 and 14 to electrically connect the both electrodes 12 and 14 by the metal particles 22 (partially expanded diagram shown in FIG. 1).

After a definite time has passed, the both circuit boards 11 and 13 are stopped heating, the sucking of the second circuit board 13 is freed and the thermocompression bonding head 32 is retreated upward. Thereby, the production of the electronic component mounting structure 1 comes to completion (FIG. 2C).

As mentioned above, the adhesive cured material 20' of the electronic component mounting structure 1 is one obtained by thermally curing an adhesive 20 formed by dispersing metal particles 22 in a thermosetting resin 21, is located between the first circuit board 11 and the second circuit board 13 to strongly bond the both circuit boards 11 and 13 and disposes contained metal particles 22 between the electrode 12 of the first circuit board 11 and the electrode 14 of the second circuit board 13 to electrically connect the both electrodes 12 and 14. That is, according to the embodiment, the adhesive 20 (adhesive cured material 20') works as a so-called anisotropic conductive material to electrically connect the electrodes 12 and 14 that face up and down through the metal particles 22 and to electrically isolate transversally, that is, between adjacent electrodes.

The thermosetting resin 21 that is a main component of the adhesive 20 is made of, for instance, an epoxy resin or an acrylic resin. The metal particles 22 have the melting temperature Mp lower than the glass transition temperature Tg of the cured material of the thermosetting resin 21 and is made of, for instance, an alloy that contains Sn and at least one metal selected from Pb, Ag, Zn, Bi, In, Sb and Cu. Specifically, solders such as SnZn, SnBi, SnBiAg, SnAgBiIn, SnAgCu, SnPb, and SnIn can be used as the metal particle 22.

Figure 3:
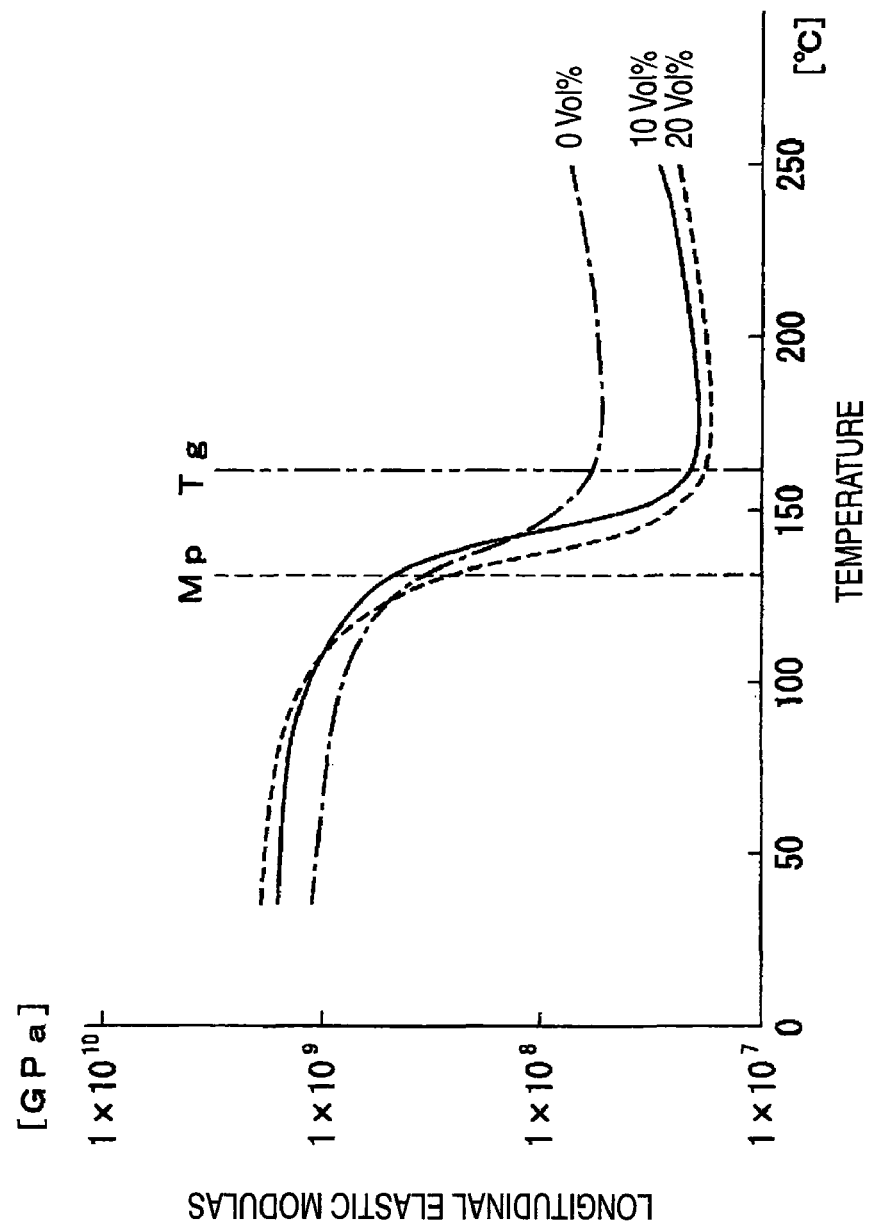
FIG. 3 is a graph showing relationship between temperatures of a cured adhesive and the longitudinal elastic moduli thereof in one embodiment of the invention.

FIG. 3 is a graph showing relationship between temperatures and longitudinal elastic moduli (Young's moduli) of an adhesive cured material 20' where the thermosetting resin 21 is an epoxy resin (an imidazole type curing agent is mixed) and the metal particle 22 is a SnBi alloy having an average particle diameter of 30 μm. Here, a content of the metal particles 22 in an entirety of the adhesive 20 is varied in three levels of 0% by volume, 10% by volume and 20% by volume. In the example, the glass transition temperature Tg of the cured material of the thermosetting resin 21 is substantially 165° C. and the melting temperature Mp of SnBi alloy is substantially 130° C.

From the graph of FIG. 3, it is found that when the adhesive cured material 20' of the embodiment is being heated, before a temperature of the adhesive cured material 20' reaches the glass transition temperature Tg of the cured material of the simple thermosetting resin 21 (called as a resin cured material), apparent longitudinal elastic modulus of the adhesive cured material 20' rapidly decreases, that is, the softening starts at a temperature lower than the glass transition temperature Tg of the resin cured material. This is considered because, since the melting temperature Mp of the metal particles 22 dispersed in the thermosetting resin 21 is lower than the glass transition temperature Tg of the resin cured material, before a temperature of the adhesive cured material 20' reaches the glass transition temperature Tg of the resin cured material, the metal particles 22 are melted.

On the other hand, when the temperature of the adhesive cured material 20' comes close to the glass transition temperature Tg of the resin cured material, the linear expansion coefficient of the adhesive cured material 20' rapidly increases and thereby the adhesive cured material 20' expands largely. That is, when the adhesive cured material 20' is heated exceeding the glass transition temperature Tg of the resin cured material, the adhesive cured material 20' starts softening followed by thermally expanding largely.

Thus, the adhesive 20 in the embodiment is formed by dispersing metal particles 22 having a melting temperature lower than the glass transition temperature Tg of the cured material of the thermosetting resin 21 in the thermosetting resin 21, and the electronic component mounting structure 1 in the embodiment is formed by bonding the first circuit board 11 and the second circuit board 13 with the adhesive 20. In the electronic component mounting structure 1 where the adhesive cured material 20' is interposed between the first circuit board 11 and the second circuit board 13, even when it is exposed to a large temperature variation due to the heat cycle test, unlike an existing adhesive cured material where an adhesive cured material rapidly starts thermally expanding in a hard state, the thermal stress working on a joining surface S (a partially enlarged diagram in FIG. 1) between the adhesive cured material 20' and both the circuit boards 11 and 13 does not become excessively large; accordingly, the cracks and peelings in the joining surface S can be inhibited from occurring. The glass transition temperature Tg of the cured material of the thermosetting resin 21 extends over a certain temperature range (width); accordingly, in order to impart a certain extent of temperature difference (tolerance) between the melting temperature of the metal particle 22 and the glass transition temperature of the cured material of the thermosetting resin 21, the melting temperature of the metal particle 22 is preferably set lower by 10° C. or more than the glass transition temperature of the cured material of the thermosetting resin 21.

Here, a content of the metal particles 22 in an entirety of the adhesive 20 is preferred to be 20% by volume or less. This is because, as obvious from graphs of FIG. 3, the content of the metal particles 22 in the entire adhesive 20 and the longitudinal elastic modulus of the adhesive cured material 20' are correlated, when the adhesive cured material 20' is heated, at 20% by volume or less, the lowering rate of the longitudinal elastic modulus of the adhesive cured material 20' is larger as the content of the metal particles 22 is larger and thereby the thermal stress working on a joining surface can be largely alleviated. However, when the content of the metal particles 22 exceeds 20% by volume, the viscosity of the adhesive 20 becomes excessively larger to be difficult to use as the adhesive 20 and to be high in the cost. In a temperature that exceeds the glass transition temperature Tg of the resin cured material, even when the content of the metal particles 22 is 0% by volume, the longitudinal elastic modulus of the adhesive cured material 20' largely decreases. However, since the linear expansion coefficient rapidly increases in the region, in order to make a ratio of a decrease in the longitudinal elastic modulus of the adhesive cured material 20' to an increase in the linear expansion coefficient (a ratio of softening of the adhesive cured material 20') sufficiently larger, the content of the metal particles 22 in the entire adhesive 20 is preferably 3% by volume or more, that is, in the range of 3 to 20% by volume.

Furthermore, in the adhesive 20 in the embodiment, an inorganic filler is preferably dispersed in the thermosetting resin 21. When the inorganic filler is dispersed in the thermosetting resin 21, the linear expansion coefficient of the adhesive cured material 20' can be reduced as a whole and thereby the thermal stress applied on a joining surface S can be further alleviated. However, when a content of the inorganic filler in an entire adhesive 20 is excessively large, the viscosity of the adhesive 20 becomes very high to be difficult to use; accordingly, the content of the inorganic filler is preferably 50% by weight or less.

Still furthermore, in the adhesive 20 in the embodiment, particle diameters of the metal particles 22 dispersed in the thermosetting resin 21 are preferably 30 µm or less. This is because, in the case of the adhesive 20 (adhesive cured material 20') being used as an anisotropic conductive material, when a separation of adjacent electrodes of the electronic component mounting structure 1 is considered to be substantially 300 µm, as a particle diameter that does not short-circuit the adjacent particles each other, 30 µm is considered the upper limit.

In order to alleviate the thermal stress applied on the joining surface S of the electronic component mounting structure 1, a method where, to the thermosetting resin 21, a low elastic resin such as rubber particles or a resin having the plasticity is added can be considered. However, the compatibility of the rubber particles or the resin and the thermosetting resin 21 that is a base is not necessarily good. When the compatibility is not good, there may be caused inconveniences such that the adhesive force is deteriorated. In the point, as shown in the embodiment, when the metal particles 22 dispersed in the thermosetting resin 21 are made of an alloy made of Sn and at least one metal selected from Pb, Ag, Zn, Bi, In, Sb and Cu, the compatibility has not to be cared. This means that a selection width of the thermosetting resin 21 expands and thereby a thermosetting resin 21 corresponding to required physical properties and performances can be readily selected. Furthermore, when the metal particles 22 are made of an alloy of the metal, the adhesive 20 (adhesive cured material 20') can be worked as the anisotropic conductive material and, furthermore, depending on the selection of a metal composition of the metal particles 22, the melting temperature of the metal particles 22 can be advantageously freely controlled.

In the above, the embodiment of the invention was described. However, the invention is not restricted to the embodiment. For instance, in the embodiment, the adhesive cured material 20' in the electronic component mounting structure 1 electrically connects, due to the metal particles 22 dispersed in the thermosetting resin 21, the electrode 12 of the first circuit board 11 and the electrode 14 of the second circuit board 13 to work as an anisotropic conductive material. However, in the electronic component mounting structure of the invention, two electronic components of which electrodes are electrically connected have only to be joined with an adhesive of the invention, that is, an adhesive in which, in a thermosetting resin, metal particles having the melting temperature lower than the glass transition temperature of a cured material of the thermosetting resin are dispersed. That is, a cured material of an adhesive does not necessarily work as an anisotropic conductive material.

Furthermore, in the electronic component mounting structure 1, the electrode 12 of the first circuit board 11, a first electronic component, and the electrode 14 of the second circuit board 13, a second electronic component, are electrically connected and the adhesive cured material 20' obtained by thermally curing the adhesive 20 mainly made of the thermosetting resin 21 joins both the circuit boards 11 and 13. However, as the electrical connection between the electrodes 12 and 14, other than a case where as shown in the embodiment both electrodes 12 and 14 are connected through the metal particles 22, a case where both electrodes 12 and 14 are brought into direct contact each other to connect and a case where both electrodes 12 and 14 are connected through metal bumps, solder bumps or solder pre-coats that are formed in advance are included.

INDUSTRIAL APPLICABILITY

In an electronic component mounting structure obtained by joining electronic components, cracks and peelings can be inhibited from occurring.

The invention claimed is:

1. An electronic component mounting adhesive, comprising:
   a thermosetting resin; and
   metal particles dispersed in the thermosetting resin wherein the metal particles have a metal temperature lower by 10° C. or more than a glass transition temperature of a cured material of the thermosetting resin,
   wherein a content of the metal particles is not more than 20% by volume, and
   wherein a cured material of the adhesive has a greater apparent longitudinal elastic modulus decrease than the thermosetting resin cured material when heated to the glass transition temperature.

2. The electronic component mounting adhesive of claim 1, wherein the metal particles are made of an alloy containing Sn, Bi and at least one metal selected from Pb, Ag, Zn, In, Sb and Cu.

3. The electronic component mounting adhesive of claim 1, wherein an inorganic filler is dispersed in the thermosetting resin.

4. The electronic component mounting adhesive of claim 1, wherein particle diameters of the metal particles are 30 μm or less.

5. An electronic component mounting structure, comprising:
   a first electronic component with an electrode;
   a second electronic component with an electrode that is electrically connected to the electrode of the first electronic component; and
   an adhesive cured material that is obtained by curing an electronic component mounting adhesive mainly made of a thermosetting resin and connects both the electronic components,
   wherein, in the adhesive cured material, metal particles having a melting temperature that is 10° C. or more lower than a glass transition temperature of the thermosetting resin cured material are contained,
   wherein a content of the metal particles is not more than 20% by volume, and
   wherein the adhesive cured material has a greater apparent longitudinal elastic modulus decrease than the thermosetting resin cured material when heated to the glass transition temperature.

6. The electronic component mounting structure of claim 5, wherein the metal particles are made of an alloy containing Sn, Bi and at least one metal selected from Pb, Ag, Zn, In, Sb and Cu.

7. An electronic component mounting adhesive, comprising:
   a thermosetting resin; and
   metal particles dispersed in the thermosetting resin and having a melting temperature lower than a glass transition temperature of a cured material of the thermosetting resin,
   wherein a content of the metal particles is not more than 20% by volume, and
   wherein the thermosetting resin is an epoxy resin and the metal particles are made of a SnBi-type alloy.

* * * * *